United States Patent
Bower et al.

(10) Patent No.: US 8,866,080 B2
(45) Date of Patent: Oct. 21, 2014

(54) FARADAY CUP ARRAY INTEGRATED WITH A READOUT IC AND METHOD FOR MANUFACTURE THEREOF

(75) Inventors: Christopher A. Bower, Raleigh, NC (US); Kristin Hedgepath Gilchrist, Durham, NC (US); Brian R. Stoner, Chapel Hill, NC (US); Dorota Temple, Cary, NC (US)

(73) Assignee: Research Triangle Institute, Research Triangle Park, NC (US)

( * ) Notice: Subject to any disclaimer, the term of this patent is extended or adjusted under 35 U.S.C. 154(b) by 1049 days.

(21) Appl. No.: 12/921,508

(22) PCT Filed: Feb. 27, 2009

(86) PCT No.: PCT/US2009/035375
§ 371 (c)(1),
(2), (4) Date: Sep. 8, 2010

(87) PCT Pub. No.: WO2009/114291
PCT Pub. Date: Sep. 17, 2009

(65) Prior Publication Data
US 2011/0031388 A1    Feb. 10, 2011

Related U.S. Application Data

(60) Provisional application No. 61/036,851, filed on Mar. 14, 2008.

(51) Int. Cl.
*G01N 23/00*      (2006.01)
*H01J 37/244*    (2006.01)
*H01J 49/02*      (2006.01)
*H01J 49/00*      (2006.01)

(52) U.S. Cl.
CPC ............. *H01J 49/025* (2013.01); *H01J 37/244* (2013.01); *H01J 49/0018* (2013.01); *H01J 2237/24405* (2013.01)
USPC ........................................................ 250/336.1

(58) Field of Classification Search
CPC ................................. H01J 49/25; G01N 23/00
USPC ............................ 250/281, 336.1, 423 R, 489
See application file for complete search history.

(56) References Cited

U.S. PATENT DOCUMENTS

| | | |
|---|---|---|
| 3,582,645 A | 6/1971 | Brunnee et al. |
| 4,602,282 A | 7/1986 | Kurono et al. |
| 5,773,834 A | 6/1998 | Yamamoto et al. |
| 5,841,137 A | 11/1998 | Whitney |
| 6,339,281 B2 | 1/2002 | Lee et al. |
| 2005/0274888 A1 | 12/2005 | Darling et al. |

OTHER PUBLICATIONS

U.S. Appl. No. 12/921,525, filed Sep. 8, 2010, Bower, et al.

*Primary Examiner* — David Porta
*Assistant Examiner* — Faye Boosalis
(74) *Attorney, Agent, or Firm* — Oblon, Spivak, McClelland, Maier & Neustadt, L.L.P.

(57) ABSTRACT

A detector array and method for making the detector array. The array includes a substrate including a plurality of trenches formed therein, and includes a plurality of collectors electrically isolated from each other, formed on the walls of the trenches, and configured to collect charge particles incident on respective ones of the collectors and to output from said collectors signals indicative of charged particle collection. The array includes a plurality of readout circuits disposed on a side of the substrate opposite openings to the collectors. The readout circuits are configured to read charge collection signals from respective ones of the plurality of collectors.

45 Claims, 15 Drawing Sheets

FARADAY CUP ARRAY INTEGRATED WITH A READOUT IC AND METHOD FOR MANUFACTURE THEREOF

STATEMENT REGARDING FEDERALLY SPONSORED RESEARCH

The U.S. Government has a paid-up license in this invention and the right in limited circumstances to require the patent owner to license others on reasonable terms as provided for by terms of Contract NNL-04-AA21A from NASA.

CROSS REFERENCE TO RELATED APPLICATIONS

This application is related to U.S. Application Ser. No. 61/036,844, filed on Mar. 14, 2008, entitled "HIGH DENSITY FARADAY CUP ARRAY OR OTHER OPEN TRENCH STRUCTURES AND METHOD FOR MANUFACTURE THEREOF," the entire contents of which are incorporated herein by reference.

BACKGROUND OF THE INVENTION

1. Field of the Invention

This invention is related to a charged particle detector and methods for fabricating and using the electron detector.

2. Description of the Related Art

In general, a Faraday cup is regarded as a simple detector of charged particle beams. A faraday cup typically includes an inner cup concentrically located within a grounded outer cup. Faraday cups are known for their large dynamic range and ability to function in a wide range of environments, including atmospheric pressure. Well designed and shielded Faraday cups have been reported to measure currents down to $10^{-15}$ A, corresponding to $10^4$ charged particles per second. While electron multipliers are more sensitive, Faraday cup detectors provide quantitative charge measurements with high precision and stable performance. For instance, electron multipliers are susceptible to degradation over time due to sputtering of the electron conversion material, and the gain of these detectors can vary depending on the mass of the impending ions.

Faraday cup arrays designed for use in a mass spectrometer have been previously built which included an array of MOS capacitors formed on the interior of high aspect ratio deep etched trenches in n-type silicon. In those designs, the silicon between each cup served to electrically shield cups from their neighbors, enabling low signal cross-talk. Linear arrays of 64, 128 and 256 cups at pitches of 150 µm and 250 µm have been fabricated. The width spacing between the cups was typically limited to 50 µm. Detector arrays have been fabricated where for ion detection metal strip electrodes or MOS capacitors were used.

The following references all of which are incorporated in their entirety by reference describe this work and other background work.

1. D. Bassi, in: G. Scoles (Ed.), Atomic and Molecular Beam Methods, vol. 1, Oxford University Press, New York, 1988, PP. 180-192 (Chapter 8).
2. A. K. Knight, R. P. Sperline, G. M. Hieftje, E. Young, C J. Barinaga, D. W. Koppenaal, M. B. Denton, The development of a micro-Faraday array for ion detection, Int. J. Mass Spectrom. 215 (2002) 131-139.
3. R. B. Darling. A. A. Scheidemann, K. N. Bhat, T.-C. Chen, Micromachined Faraday cup 10 array using deep reactive ion etching, Sens. Actuators. A 95 (2002) 84-93.
4. A. A. Scheidemann, R. B. Darling, F. J. Schumacher, A. Isakharov, Faraday cup detector array with electronic multiplexing for multichannel mass spectrometry, J. Vac. Sci. Technol. A 20(3) (2002) 597-604.
5. K. Birkinshaw. Mass spectrum measurement using a one-dimensional focal plane detector, Int. J. Mass Spectrom. 215 (2002) 195-209.
6. D. Nevejans, E. Neefs, S. Kavadias, P. Merken, C Van Hoof The LEDA5 12 integrated 20 circuit anode array for the analog recording of mass spectra, Int. J. Mass Spectrom. 215 (2002) 77-87.
7. M. P. Sirtha and M. Wadsworth, Miniature focal plane mass spectrometer with 1000-pixel modified-CCD detector array for direct ion measurement, Rev. Sci. Instrum. 76 (2005) 25 025103.
8. D. W. Koppenaal, C. J. Barinaga, M. B. Denton, R. P. Sperline, G. M. Hiefije, G. D. Schilling, F. J. Andrade, J. H. Barnes, M S Detectors, Anal. Chem. 77(21) (2005) 418A-427A.
9. K. Birkinshaw, Deconvolution of mass spectra measured with a non-uniform detector array to give accurate ion abundances, J. Mass Spectrom. 38 (2003) 206-210.
10. G. A. Eiceman, J. A. Stone, Ion Mobility Spectrometers in National Defense, Anal. Chem. 76(21) (2004) 390A-397A.
11. J. Petinarides, M. T. Griffin, R. A. Miller, E. G. Nazarov, A. D. Bashall, Implementation of a new technology for point detection," Chemical and Biological Sensing VI, ed. P. J. Gardner, Proc. SPIE Vol. 5795 (SPIE, Bellingham, Wash., 2005).
12. C. A. Bower, D. Malta, D. Temple, J. E. Robinson, P. R. Coffinan, M. R. Skokan, T. B. Welch, High density vertical interconnects for 3-D integration of silicon integrated circuits, 56th Electronic Components and Technology Conf. Proc., San Diego, Calif. May 30-Jun. 2, 2006.
13. W. F. Beach, C. Lee, D. R. Bassett, T. M. Austin, R. Olson, "Xylylene Polymers", Encyclopedia of Polymer Science and Engineering, 2' ed. (Wiley, New York, 1989), Vol. 17, p. 990-1025.
14. J. F. McDonald, H. T. Lin, H. J. Greub, R. A. Philhower, S. Dabral, Techniques for 50 fabrication of wafer scale interconnections in multichip packages, IEEE Trans. Comp., Hybrids, Manuf. Technol., 12(2) (1989) 195-205.
15. A. C. Adams, C. D. Capio, The deposition of silicon dioxide films at reduced pressure, J. Electrochem. Soc., 126(6) (1979) 1042-1046.
16. K. H. Dietz, Dry Film Photoresist Processing Technology, (Electrochemical Publications, 5 Ltd., Isle of Man, British Isles, 2001).
17. J. A. T. Norman, B. A. Muratore, P. N. Dyer, D. A. Roberts, A. K. Hochberg, L. H. Dubois, A net metal-organic chemical vapor deposition process for selective copper metallization, Mater. Sci. Eng., B 17 (1993), 87-92.
18. U.S. Pat. No. 6,847,036.
19. R. B. Darling, A. A. Scheidemarm, K. N. Bhat. T.-C. Chen, Micromachined Faraday cup array 15 using deep reactive ion etching, Sens. Actuators, A 95 (2002) 84-93.
20. A. A. Scheidemann, R. B. Darling, F. J. Schumacher, A. Isakharov, Faraday cup detector array with electronic multiplexing for multichannel mass spectrometry, J. Vac. Sci. Technol, A 20(3) (2002) 597-604.
21. O. Kornienko, P. T. A. Reilly, W. B. Whitten, and J. M. Ramsey, Anal. Chem. 72, 559 (2000).
22. C. Dong and G. R. Myneni, Appl. Phys. Lett. 84, 5443 (2004).
23. I.-M. Choi and S.-Y. Woo, Appl. Phys. Lett. 87, 173104 (2005).

24. C. Dong and G. R. Myneni, J. Vac. Sci. Technol. A 17, 2026 (1999).
25. B. R. Chalamala, R. H. Reuss, and K. A. Dean, Appl. Phys. Lett. 79, 2648 (2001).
26. C. Bower, W. Zhu, D. Shalom, D. Lopez, L. H. Chen, P. L. Gammel, and S. Jin, Appl. Phys. Lett. 80, 3820 (2002).
27. C. Bower, D. Shalom, W. Zhu, D. Lopez, G. P. Kochanski, P. L. Gammel, and S. Jin, IEEE Trans. Electron Devices 49, 1478 (2002).
28. J. Carter, A. Cowen, B. Hardy, R. Mahadevan, M. Stonefield, and S. Wilcenski, The PolyMUMPS Design Handbook, MEMSCAP Inc., Durham, N. C., 2005 (available at http://www.memscap.com/mumps/documents/PolyMUMPs.DR.v11.pdf).
29. H. Cui, O. Zhou, and B. R. Stoner, J. Appl. Phys. 88, 6072 (2000).
30. C. Bower, O. Zhou, W. Zhu, D. J. Werder, and S. Jin, Appl. Phys. Lett. 77, 2767 (2000).

SUMMARY

In one embodiment of the invention, there is provided a detector array, including a substrate including a plurality of trenches formed therein, and includes a plurality of collectors electrically isolated from each other, formed on the walls of the trenches, and configured to collect charge particles incident on respective ones of the collectors and to output from the collectors signals indicative of charged particle collection. The array includes a plurality of readout circuits disposed on a side of the substrate opposite openings to the collectors. The readout circuits are configured to read charge collection signals from respective ones of the plurality of collectors.

In one embodiment of the invention, there is provided a method for making a detector array. The method forms in a substrate a plurality of trenches across a surface of the substrate, forms in the plurality of trenches a plurality of collectors, forms a plurality of readout connections on a side of the substrate opposite openings to the collectors with the readout connections being configured to collect signals from respective ones of the plurality of collectors, and connects respective ones of the plurality of readout connections to respective ones of the plurality of the collectors.

In one embodiment of the invention, there is provided a system for collecting charged particles. The system includes a charged particle source configured to produce the charged particles and a detector array configured to collect the charged particles. The detector array includes a substrate including a plurality of collectors formed in the substrate and disposed in sequence across a surface of the substrate, a plurality of trenches formed in the substrate to accommodate therein the plurality of collectors, a plurality of readout circuits disposed on a side of the substrate opposite openings to the collectors. The readout circuits are configured to collect signals from respective ones of the plurality of collectors.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

The invention is directed to the microfabrication of Faraday cup arrays for use as a charged particle or photon detection device. The detector device in one embodiment of the invention includes an array of microfabricated Faraday cups, where each microfabricated Faraday cup acts as an electrically shielded collector of charged particles (electrons or ions).

Figure 1:
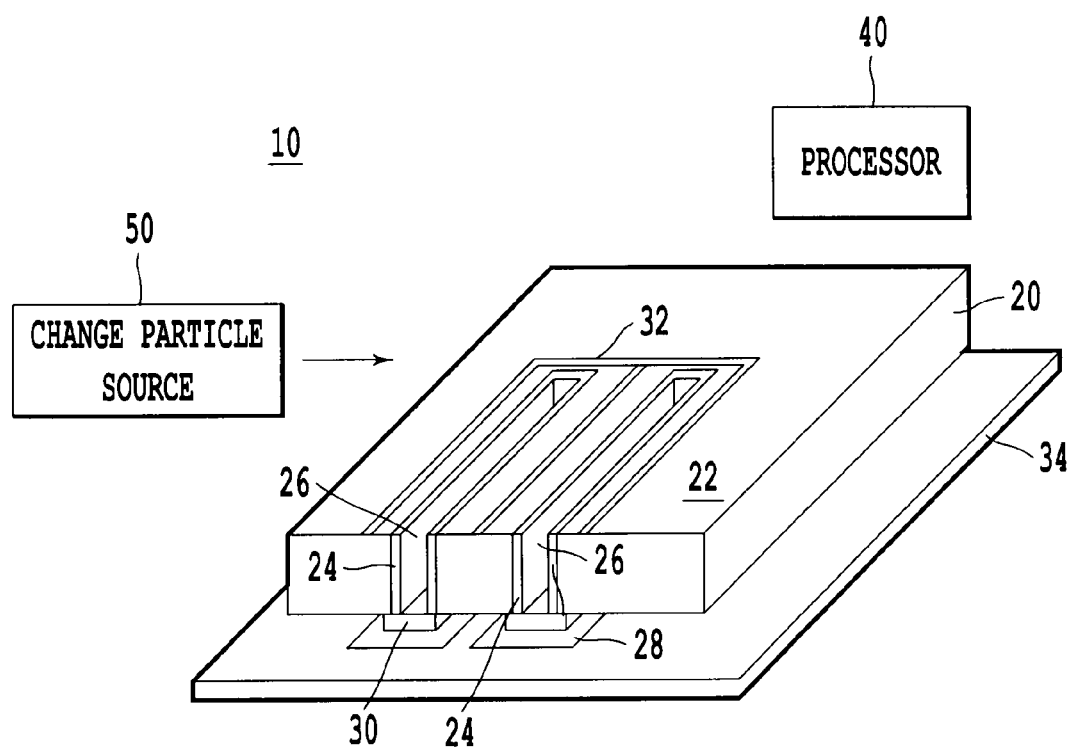
FIG. 1 is a schematic showing one embodiment of the invention of a system 10 for charged particle or photon detection.

Referring now to the drawings, wherein like reference numerals designate identical or corresponding parts throughout the several views, FIG. 1 shows one embodiment of the invention of a system 10 for charged particle or photon detection. The system 10 of FIG. 1 includes a detector array 20 including a substrate 22 having a plurality of collectors 24 formed in the substrate 22 and disposed in sequence across a surface of the substrate 22. FIG. 1 shows trenches 26 formed in the substrate to accommodate the collectors 24. As discussed below, in various embodiments of the invention, the trenches are disposed in a linear arrangement (as shown here and below) and have high aspect ratios. Indeed, while shown in FIG. 1 in a linear one dimensional configuration, the invention is not limited to this configuration but rather can include in various embodiments staggered, non-staggered, elongated, non-elongated, circular, oval, honeycomb, and other geometric configurations.

Regardless of the trench configuration, in one embodiment of the invention, the collectors 24 are respectively connected by way of readout connections (not shown) to a plurality of readout circuits 28 disposed on a side of the substrate opposite openings to the collectors 24. The readout circuits are configured to read signals from respective ones of the collectors 24. Electrodes 30 connect respective ones of the readout circuits 28 to respective ones of the collectors 24. For the sake of simplicity, only two collectors 24 connected to two readout circuits 28, having two electrodes 30 are shown in FIG. 1.

The trenches 26 can have widths ranging from 5 µm to 100 µm, and can have lengths up to 10 mm. The trenches 26 can have an aspect ratio ranging from 4:1 to 12:1. The collectors as a group can occupy more than 80%, 90%, or 95% of a surface of the substrate 22. The trenches 26 can form a set of position sensitive detectors. A substrate wall between the trenches can have a thickness less than 50 µm. As a result, the trenches 26 can form a set of high density position sensitive detectors. In one embodiment, as discussed in more detail below, the collectors 24 can an isolation resistance between adjacent ones of the collectors greater than $1 \times 10^{10} \Omega$.

The collectors 24 can be made of any conductive material including for example copper, aluminum, gold, platinum, and tungsten or combinations thereof. Besides the collectors, FIG. 1 shows a metal layer 32 patterned on the substrate 22 disposed in a vicinity of the collectors 24. In one embodiment, the readout circuits are used for measuring the charge collected in each collector 24 over time (integrated) or as a function of time (instantaneous). The readout circuits 28 in one embodiment can be included on another chip separate from the chip carrying the detector array 20 and attached thereto as described below. In one embodiment, the metal layer 32 serves as a ground reference and/or a suppression grid for the detector array 20.

For example, a suppressor grid can be used in various embodiments to prevent secondary emission from the cup. A suppressor grid is a metal trace that weaves between the Faraday cup collectors. A bias voltage can be applied to the suppressor grid (for example by the readout circuits 28) to prevent the escape of secondary electrons generated inside the cup. The suppressor grid can also serve as an energy filter for incoming charged particles.

The system 10 of FIG. 1 in one embodiment can also include or be connected to a charged particle source 50 which directs charged particles to the detector array 20 where the charged particles are collected by the collectors 24 which act as individual electrodes monitoring the charge accumulation thereon with time. In various embodiments, the charged particle source can include an ion source or an electron source or a combination thereof. In various embodiments, the charged particle source can include a hot filament, microwave plasma, or other ion sources known in the art which provide an ion into a detector region. In one embodiment, the charged particle source can include an electron-injector material or a photosensitive material 34 disposed in a vicinity of the collectors, which emits an electron (or electrons) as a charged particle or as charged particles upon receiving light or x-ray or high energy particle thereon. For example, the collectors 24 shown in FIG. 1 could themselves contain a coating of photosensitive material or electron injector material. Accordingly, the detector array 10 can be a part of a Faraday cup array, a magnetic sector ion detector, a detector in scanning or transmission electron microscope, a charged particle detector, an x-ray detector, a photon detector, and/or a chemical sensor.

In those embodiments, the detector array 20 serves as a positional sensor regarding individual collector currents in time and in position. For example, in a magnetic sector field detector, ions emitted from an ion source can be directed in a direction transverse to the longitudinal axis of for example elongated collectors 24 and can be introduced into a magnetic field sector. In the magnetic field sector, the ions will travel along trajectories in the magnetic field which depend on their charge/mass ratio. Lower charge to mass ions are curved the most and will arrive a position along the detector array which for example is closer to the charged particle source than a higher charge to mass ions. The higher charge to mass ions will be incident on and then collected on for example those collectors farther from the charged particle source. Similarly, in a detector in scanning or transmission electron microscope, the detector array also serves as a positional sensor regarding individual collector currents in time and in position. Electrons from the imaging optics are deflected according to their kinetic energy such that lower energy electrons will be more substantially deflected than higher energy electrons. Here, the lower energy electrons will be incident on and then collected on for example those collectors closest to the charged particle source. In optical dispersion devices, light will be diffracted at different angles depending on the wavelength. Lights of different wavelengths will be incident on different regions of the detector array 20. If an electron or charge emitting material on nearby or a part of the collectors, then the electrons or charge generated will be locally collected at nearby collectors.

Further, the readout circuits 28 can collect and process the charge collection information, or signals from individual ones of the collectors 24, not only in a time coordinate (as discussed above) but also in a spatial coordinate for position sensitive information, such as for example in the magnetic sector field detector described above where the respective positions of the individual collectors 24 would be representative of different masses. The readout circuits 28 can be connected to (or be otherwise in communication with) a microprocessor, memory, and a digital I/O port capable of generating control voltages sufficient to communicate and activate the collectors 24 and the various metal layers on the substrate surface. Moreover, the readout circuits 28 by way of the microprocessor connection may exchange information to those outside system 10. The microprocessor (not shown in FIG. 1) can include computer readable medium containing program instructions for execution to process the data in a temporal and/or spatially integrated or instantaneous manner. The microprocessor may be implemented as a general-purpose computer system that performs a portion or all of the microprocessor based processing steps of the invention in response to executing one or more sequences of one or more instructions contained in a memory. Such instructions may be read into memory from another computer readable medium, such as a hard disk or a removable media drive.

The microprocessor can include at least one computer readable medium or memory, such as the controller memory, for holding instructions programmed according to the teachings of the invention and for containing data structures, tables, records, or other data that may be necessary to implement the invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

In one embodiment of the invention, the Faraday cup arrays are made as one-dimensional or elongated Faraday cups. A variety of cup geometries which can be fabricated ranging in width from 5 µm to 100 µm and having lengths up to 4 mm. Larger ranges can be made with the same process. A reasonable minimum width would be 5 µm although there are no real restrictions. Furthermore, the cup depth-to-width aspect ratios can exceed 8:1 using deep reactive ion etching technology. In some embodiments, thin silicon membranes between adjacent cups are less than 5 µm wide and 100 µm tall.

In one embodiment of the invention, there is provided an array of microfabricated Faraday cups, where each microfabricated Faraday cup acts as an electrically shielded collector of charged particles (electrons or ions). While not restricted to these examples, examples of such microfabricated Faraday cup arrays are described in "METHOD OF MANUFACTURE FOR HIGH DENSITY FARADAY CUP ARRAY OR OTHER OPEN TRENCH STRUCTURES" referenced above. In the process described in that application, the array required multiple stages of interconnect to connect to external measurement circuitry. First, the cups have to be routed to bondpads with metal fanout traces. These bond pads are then connected to an external package or measurement circuit by wire bonding. In the present invention, the readout circuits are integrated directly underneath the collector permitting more flexibility in designing the collectors in terms of their spacing and shape, and also reducing capacitance in the signal lines carrying collected current signal to the circuitry processing the collected current signal.

Figure 2A:
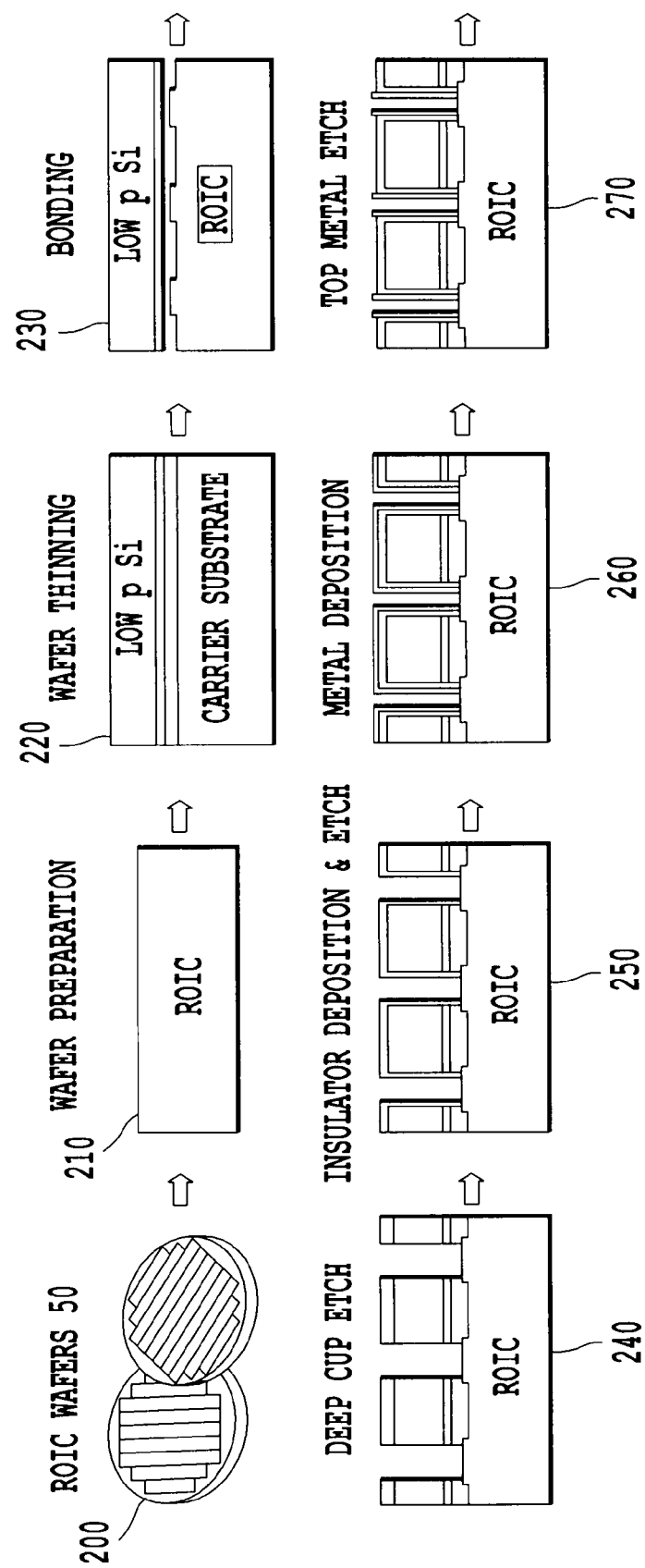
FIG. 2A is a process schematic showing one method for the formation of an integrated readout circuit detector array of the invention.
Figure 2B:
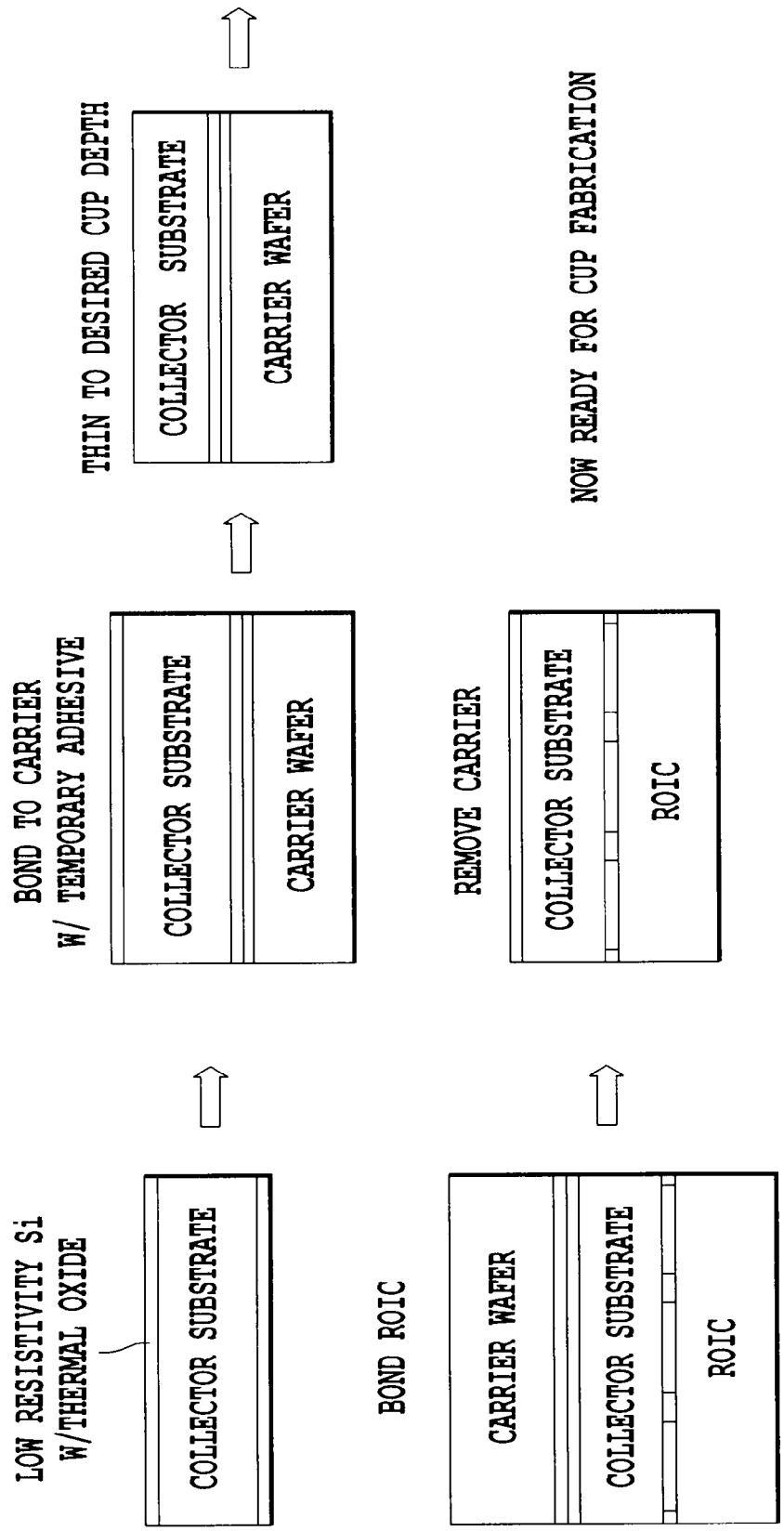
FIG. 2B is a process schematic showing a bonding aspect of the method for the formation of an integrated readout circuit detector array in FIG. 2A.
Figure 2C:
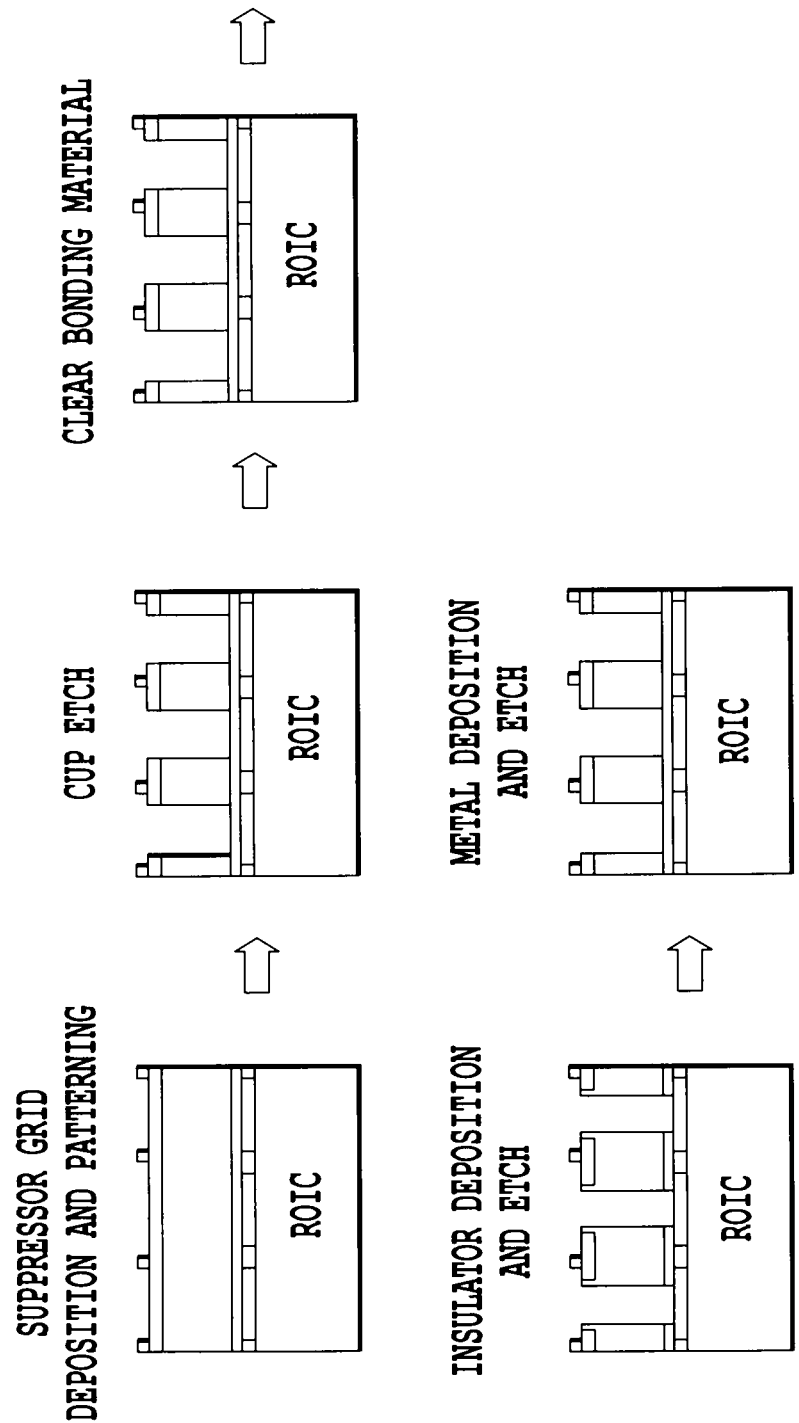
FIG. 2C is a process schematic showing a detector cup fabrication aspect of the method for the formation of an integrated readout circuit detector array in FIG. 2A.

FIG. 2A is a process schematic showing one method for the formation of the integrated readout circuit detector array of the invention. FIG. 2B shows the wafer bonding and thinning process in more detail. FIG. 2C shows the cup fabrication in more detail.

With reference to FIG. 2A, at 200, a readout integrated circuit (ROIC) wafer 50 having a plurality of readout circuits 28 (not enumerated) is provided. ROIC wafers 50 can be commercially obtained through companies such as for example FLIR Systems, Inc. 70 Castilian Dr., Goleta, Calif. 93117, USA. Custom ROIC wafers are available from Integrated Sensor Solutions, 4104 Michael Neill, Austin, Tex. 78730. In one embodiment, the pattern of readout circuits is matched to the pattern of collectors to be fabricated later and connected to the readout circuits.

Processes 210, 220, and 230 are shown in more detail in FIG. 2B. With reference to FIG. 2A, at 210, the surface of ROIC wafer 50 is prepared for bonding. The surface preparation depends on the particular type of binding process to be used. For example, borosilicate glass compounds or lower temperature spin-on-glasses compositions can be applied to the surface of ROIC wafer 50. In some instances, adhesives such a glass, polymer, and/or silicone based adhesives can be used including thermosetting and thermoplastic adhesives.

At 220, a substrate to have collectors formed therein (i.e., a collector substrate) is bonded to a carrier substrate for wafer thinning. The bonding here can use the above-noted glass binding techniques. Because there are no fabricated device circuits on the carrier substrate or the collector substrate, higher temperature and/or metallic binding compounds can be used. Alternatively, since removal of the carrier substrate is later needed, the adhesive binding as discussed above can also be a suitable bonding medium, allowing for removal of the carrier substrate through dissolution of the adhesive by solvents or release by heating above the adhesive's temperature or thermosetting rating. Once bonded, wafer thinning involving for example mechanical grinding, polishing, and/or chemical mechanical polishing techniques are used to reduce the collector substrate to a thickness equal to the desired collector depth. Standard wafer thinning for example can reduce the thickness of a silicon substrate to 10's to 100's of microns in thickness.

At 230, the thinned collector substrate is bonded to ROIC wafer 50. The bonding can use for example any one of the bonding processes discussed above. Once a bond has been made to the ROIC wafer 50, the bond to the carrier substrate can be released and the carrier substrate removed, as shown in FIG. 2B.

Processes 240, 250, and 260 are shown in more detail in FIG. 2C. With reference to FIG. 2A, at 240, the bonded thinned substrate is patterned, and collectors are formed therein. For example, trenches can be etched in the thinned substrate using deep reactive ion etching (DRIE). The trenches extend through the depth of the thinned substrate and expose the ROIC wafer 50. A standard silicon DRIE process using for example an inductively coupled plasma reactor can be used to form trenches of aspect ratios (D/W) from 1:1 to 30:1. Trenches in the range of 4:1 to 12:1 are prototypical of the invention.

Afterwards, at 250, a conformal insulator (e.g., parylene C) can be vapor deposited into the trench to serve as electrical insulation. Two separate insulator thicknesses (5800 Å and 10,900 Å) of parylene have been demonstrated as suitable for the invention. Parylene-C (PA-C) was chosen for the cup insulator because it is known to make very conformal, uniformly thick and pin-hole free films even in high aspect ratio features. The cup insulator could also be fabricated by chemical vapor deposition of tetraethylorthosilicate (TEOS) which leads to conformal films of silicon dioxide. The conformal insulator is patterned to expose underlying metal connection pads to the readout circuits.

Afterwards, at 260, a conformal collector electrode layer (such as for example Cu) is deposited for example by using metal-organic chemical vapor deposition (MOCVD). Copper as a collector electrode material is discussed below, but other metals and silicides (or combinations thereof) could be used for the collector electrode. Copper can be deposited using for example hexafluoroacetylacetonate copper(I) trimethylvinylsilane, Cu(HFAC)(TMVS) as a Cu precursor at 200° C. and 1 Torr. Cu(HFAC)(TMVS) as a Cu precursor is commercially sold as CupraSelect™ by Air Products and Chemicals. Inc. The conformal copper layer fills the trenches and connects through the hole in the conformal insulator to the ROIC substrate contact pads below. The copper also deposits on the top surface of the substrate between the trenches.

At 270, the copper on the top surface (which would electrically short adjacent collector cups) is removed from the top surface of the wafer by argon ion milling. Argon ion milling can be performed for example at a 30° angle to remove the surface copper without damaging the copper in the cups. Other angles of incidence and inert gas ions are suitable for the invention.

Figure 2D:
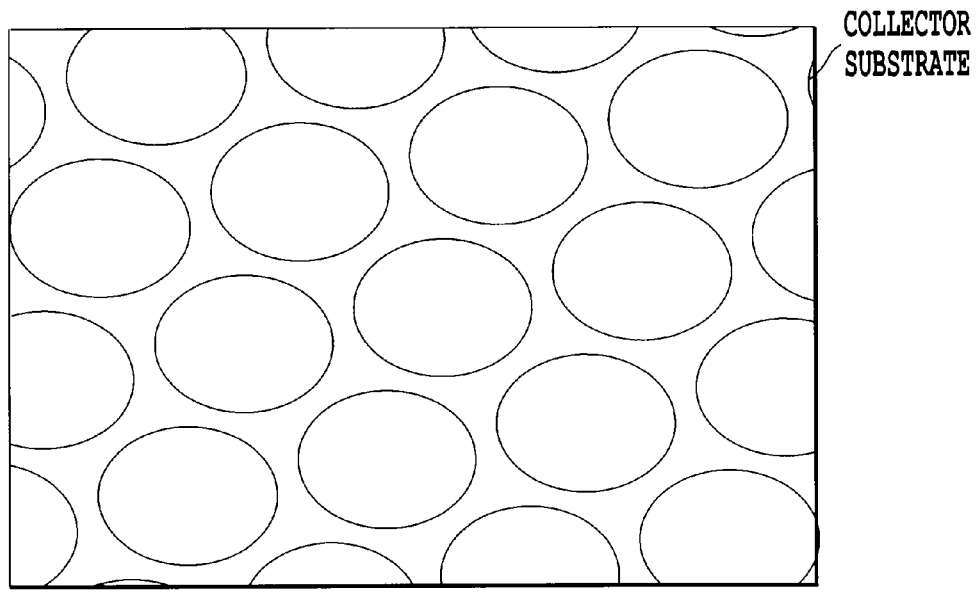
FIG. 2D is a SEM micrograph image of alternative circular trench configuration to that shown in FIG. 1.
Figure 2E:
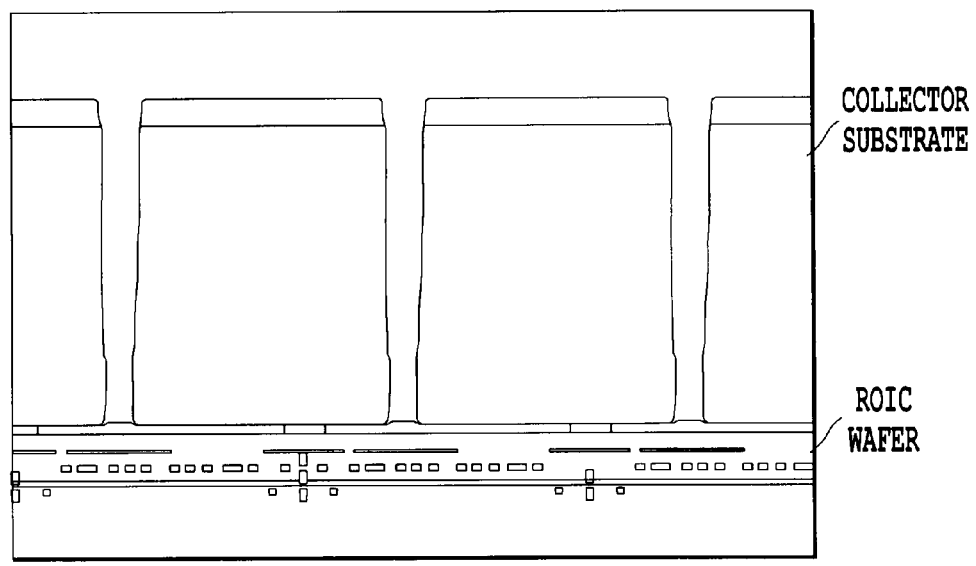
FIG. 2E is a SEM micrograph image showing a cross-section depicting the a silicon wafer bonded to a ROIC substrate.

FIG. 2D is a SEM micrograph image of alternative trench configuration to that shown in FIG. 1. As noted above, the invention is not limited to any particular trench or collector configuration, and can somewhat arbitrary pattern the trenches to any shape and configuration required or needed to match to the pattern of readout circuits on the underlying ROIC substrate. FIG. 2D shows a circular configuration. FIG. 2E is a SEM micrograph image showing a cross-section depicting a silicon wafer bonded to a ROIC substrate. While the trenches in FIG. 2E may not be of an optimal size, depiction here shows the back-side integration of a ROIC substrate to a trenched wafer structure.

Figure 3:
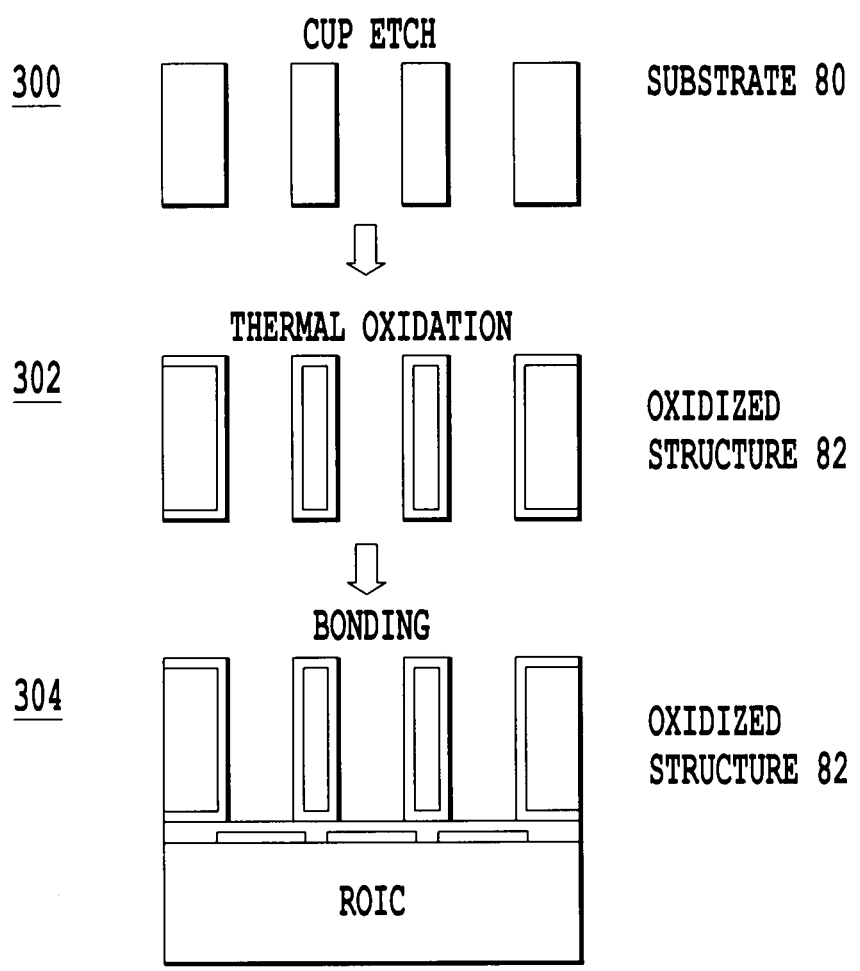
FIG. 3 is a process schematic showing another method for the formation of a bottom-side readout pad for a detector array of the invention.

FIG. 3 is a process schematic showing another method for the formation of the integrated readout circuit detector array of the invention. At step 300, a trench etch is performed on for example a thinned substrate 80. At step 302, a thermal oxidation of the thinned substrate (for example a thermal oxidation of a silicon substrate) is performed to form oxidized structure 82. At 304, the oxidized structure 82 is bonded to a ROIC substrate (or a landing substrate as described above). At that time, a conformal metal deposition follows to form the collectors 24.

Figure 4:
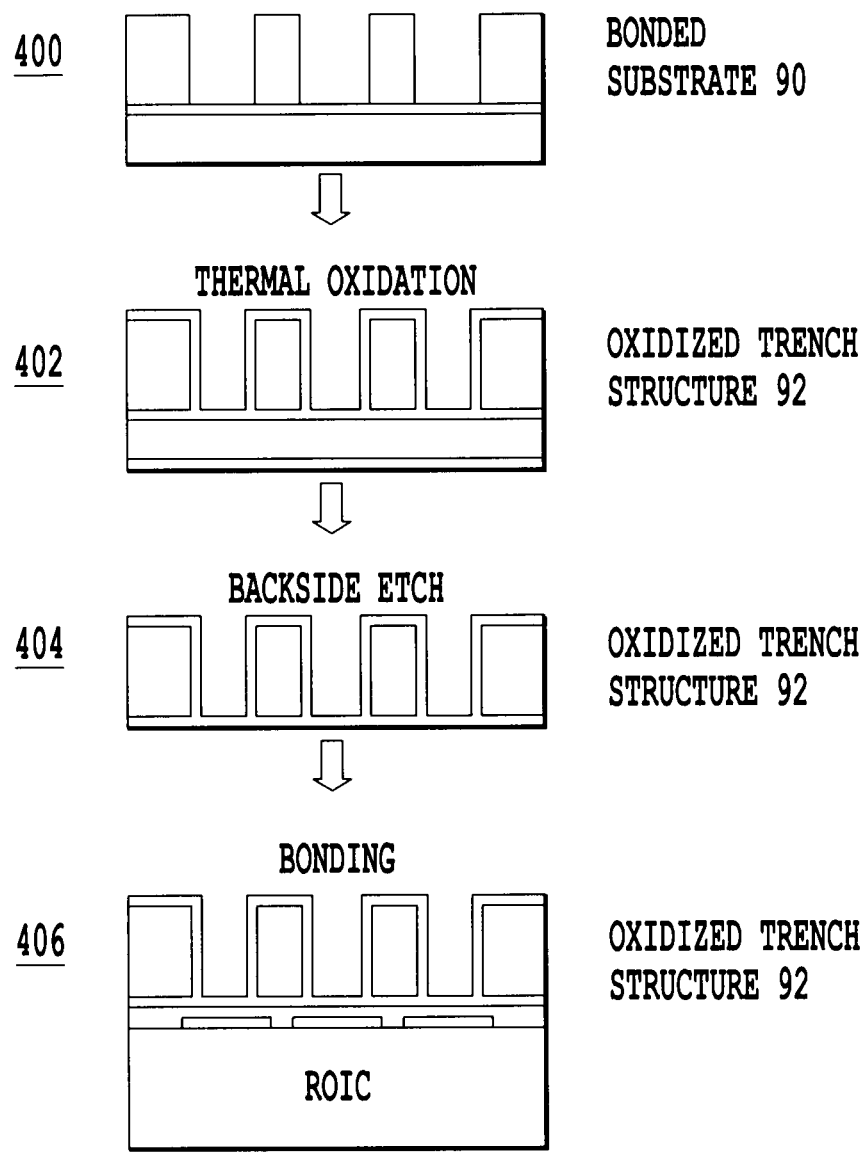
FIG. 4 is a process schematic showing another method for various embodiments of the invention.

FIG. 4 is a process schematic showing still another method for the formation of the integrated readout circuit detector array of the invention. At step 400, a bonded, thinned substrate 90 (or for example a silicon-on-insulator wafer) is etched to form trench-etched structure 92 for subsequent collector cup fabrication. In various embodiments of the invention, collector widths range from 5 to 100 μm, cup lengths from 1 to 4 mm, and cup-to-cup spacings from 5 to 25 μm. At step 402, a thermal oxidation of the trench-etched structure 92 (for example a thermal oxidation of a silicon substrate) is performed. At 404, the backside substrate is thinned. At 406, the oxidized trench-etched structure 92 is bonded to a ROIC substrate (or a landing substrate as described above). Following bonding, patterning and etching can be used to open holes in the residual amount of thinned substrate 90 in order to expose contact pads on the ROIC or landing substrate. At that time, a conformal metal deposition follows to form collectors 24.

In one embodiment of the invention, the process described above in FIG. 2A is used with a landing substrate substituted for the ROIC substrate. The process then follows with the landing substrate patterned for example with a standard photolithography liftoff process with metal being provided to form a pattern of contact pads that will ultimately be connected to the bottom of the cups of the collectors. The metallization and photolithography liftoff process also forms a fanout metallization pattern from the landing pads to contact pads at an edge of the landing substrate. In order to accommodate access to the contact pads, the landing substrate is longer in one or more directions than the trenched substrate in order to have the contact pads available around the edge of the landing substrate for electrical connection thereto. The contact pads would provide for connection to an external or integrated readout circuit for collection of charge information over time.

Figure 5A:
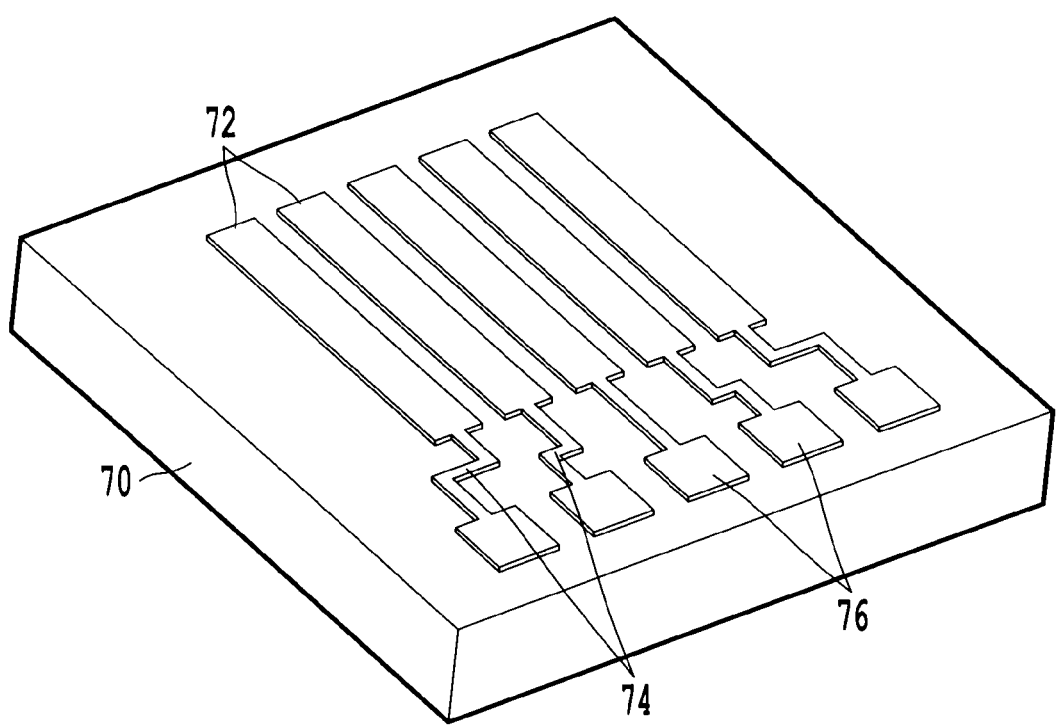
FIG. 5A is a schematic showing a landing pad according to one embodiment of the invention.

Accordingly, FIG. 5A shows a landing substrate 70 being provided that has contact pads 72 (i.e., the landing pads) matched to the pattern of collectors to be fabricated later and that has lead lines 74 from the contact pads 72 routed to peripheral positions 76 on the landing substrate 70. Optionally the contact pads could be routed to circuitry on landing substrate 70 for processing the collection current data from the collectors.

Figure 5B:
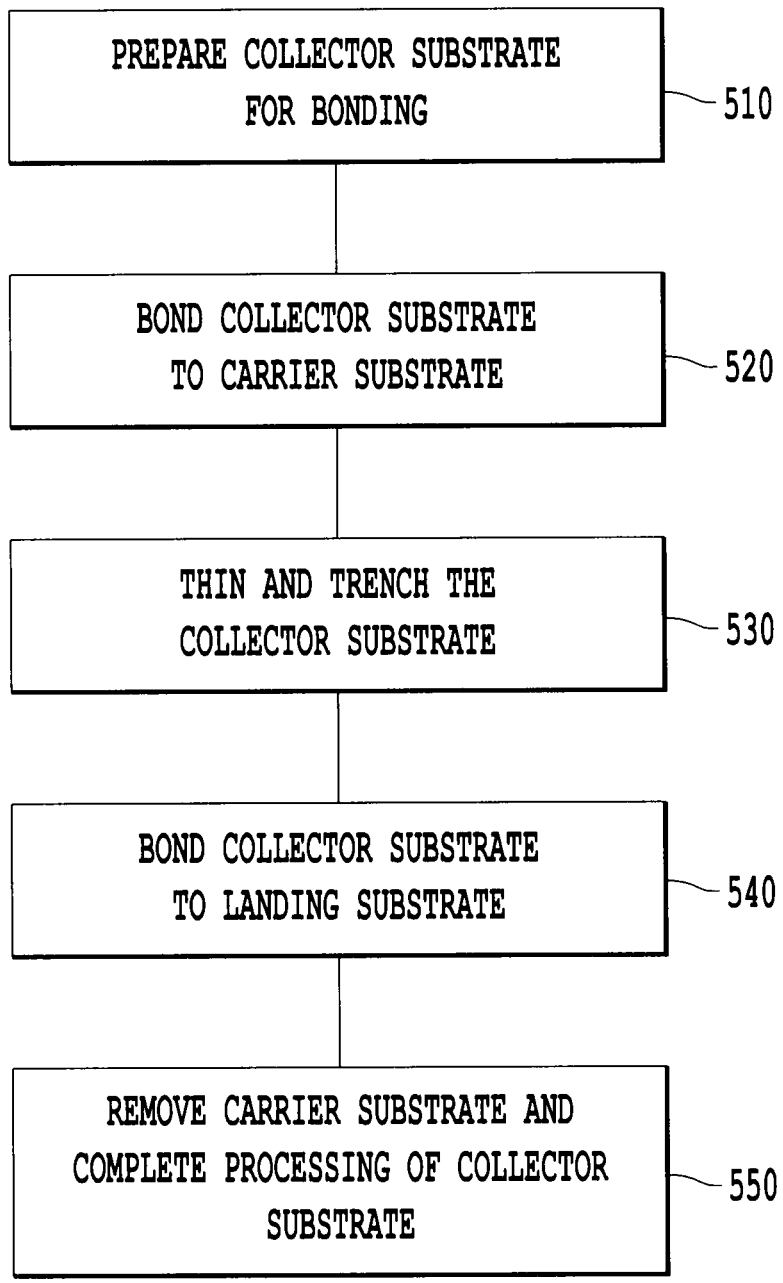
FIG. 5B is a flow chart depicting a similar process as shown n FIG. 2A.

FIG. 5B is a flow chart depicting a similar process as shown n FIG. 2A but given here for the purpose of illustrating the process for use of the landing substrate. At 510, the surface of a collector substrate is prepared for bonding. At 520, the collector substrate is bonded to a carrier substrate. At 530, the collector substrate is thinned substrate and trenched. For example, trenches can be etched in the thinned substrate using deep reactive ion etching (DRIE) as described above. The trenches extend through the thickness of thinned substrate. At 540, the thinned collector substrate is bonded to a pre-patterned landing substrate (as discussed above). At 550, the carrier substrate is removed and processing of the collector substrate is completed. For example, a conformal insulator (e.g., parylene C) can be vapor deposited into the trench to serve as electrical insulation. The conformal insulator is patterned to expose all or a part of the landing pads and contact pads on the landing substrate.

Afterwards, a conformal collector electrode layer (such as for example Cu) is deposited. The conformal copper layer fills the trenches and connects through the hole in the conformal insulator to the landing pads below. In one embodiment, the Cu forms the bottom the collector cup electrode. The copper also deposits on the top surface of the substrate between the trenches. Any copper on the top surface can be removed from the top surface of the wafer by argon ion milling.

Figure 6A:
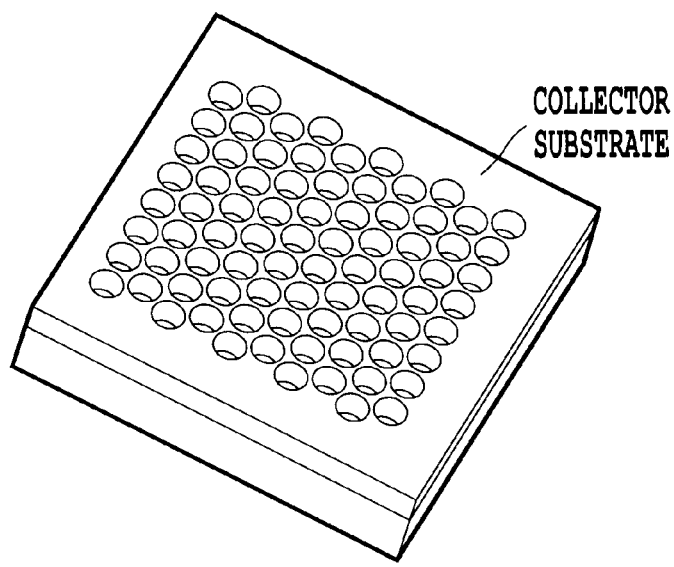
FIG. 6A is a depiction of an alternative trench configuration to that shown in FIG. 1 where circular collectors are arranged in a honeycomb configuration.
Figure 6B:
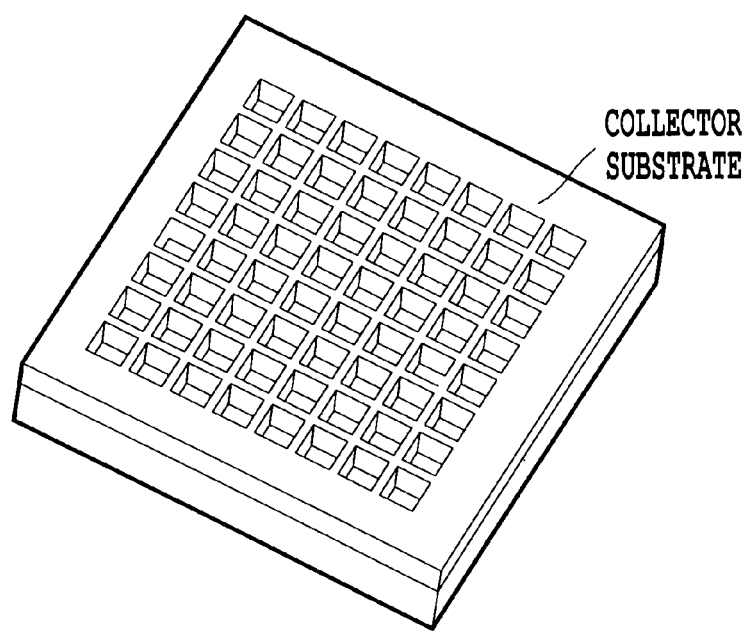
FIG. 6B is a depiction of an alternative cubicle trench configuration to that shown in FIG. 1 where cubicle collectors are arranged in a regular array configuration.

FIG. 6A is a depiction of an alternative trench configuration to that shown in FIG. 1 where circular collectors are arranged in a honeycomb configuration. FIG. 6B is a depiction of an alternative cubicle trench configuration to that shown in FIG. 1 where cubicle collectors are arranged in a regular array configuration.

Figure 7:
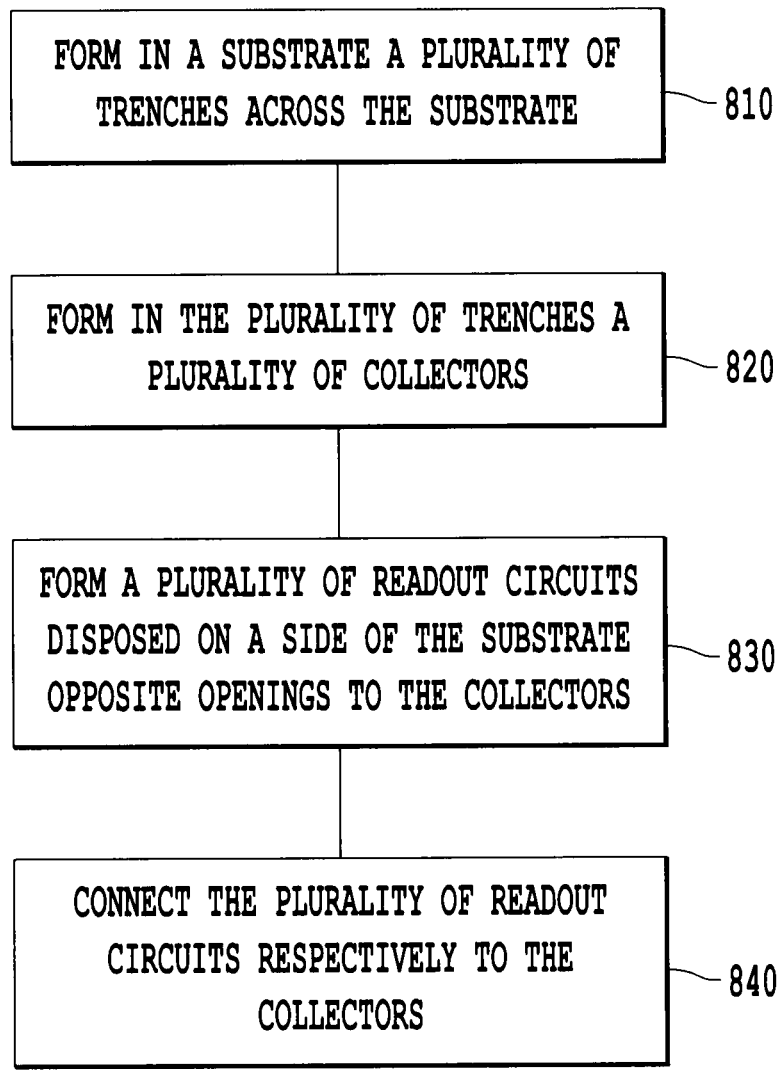
FIG. 7 is a flowchart depicting according to one embodiment of the invention a process for making a detector array.

FIG. 7 is a flowchart depicting a process for making the detector arrays of the invention. At 710, a plurality of trenches is formed in a substrate across a surface of the substrate. At 720, a plurality of collectors is formed in the plurality of trenches. At 730, a plurality of readout circuits is formed in a vicinity of the collectors with the readout circuits being configured to read signals from respective ones of the plurality of collectors. At 740, respective ones of the plurality of readout circuits are connected to respective ones of the plurality of the collectors.

At 710, the trenches can be formed by DRIE of silicon. The trenches can have widths ranging from 5 μm to 100 μm and lengths up to 10 mm. Accordingly, the trenches can have an aspect ratio ranging from 4:1 to 12:1. The trenches can occupy more than 80%, 90%, or 95% of a surface of the substrate.

At 720, the collectors can be formed on an aluminum metal, a copper metal, and/or a metal silicide. At 730, a trace metal layer can be patterned on the substrate between and around the plurality of collectors. The metal layer can function as a ground reference and/or a suppression grid for the detector array. Further, a readout circuit can be connected to the metal layer for reading signals from respective ones of the plurality of collectors.

Faraday cups or similar detectors have also been used prior to the invention as detectors in traditional magnetic sector mass analyzers. The Faraday cup serves as a single point ion detector and the magnetic field is scanned to collect particles of different mass. A detector array allows for simultaneous collection of all masses, leading to a more efficient detector. In one embodiment of the invention, the denser spacing of Faraday cups in the array as compared to previous arrays provides improved accuracy and efficiency for example in ion detector arrays in spectrometers, including spectrometers for isotope abundance measurements.

Faraday cups or similar collectors have also been used prior to the invention as chemical sensors working close to atmospheric pressure and detecting chemical agents based on ion mobility and differential ion mobility detectors. U.S. Pat. No. 6,809,313 (whose contents are incorporated herein by reference) describes the use of metal strip electrodes, not true Faraday cups, for chemical sensors. In one embodiment of the invention, the denser spacing of Faraday cups in the arrays of the invention as compared to previous Faraday cup arrays provides for improved accuracy and efficiency for use in chemical sensors and in ion mobility and differential ion mobility detectors.

Accordingly, in one embodiment of the invention, there is provided a system (such as for example system 10 in FIG. 1) for charged particle detection. The system includes a detector array configured to collect charged particles. The detector array includes (as discussed in detail above) a substrate including a plurality of trenches formed therein, a plurality of collectors electrically isolated from each other. The collectors are formed on the walls of the trenches are configured to collect charge particles incident on respective ones of the collectors. Adjacent ones of the plurality of trenches are disposed in a linear arrangement, although in other embodiments the trenches may be arbitrarily positioned and include two dimensional configurations. The system can include a charged particle source (e.g., an ion source or an electron source) for the generation of charged particles.

Figure 8A:
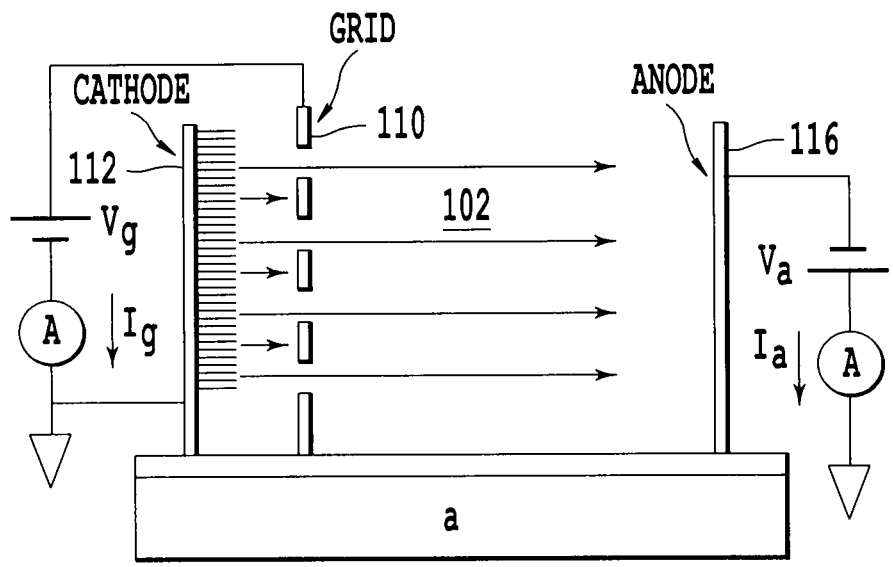
FIG. 8A is a schematic of a triode electron source for one embodiment of the invention.
Figure 8B:
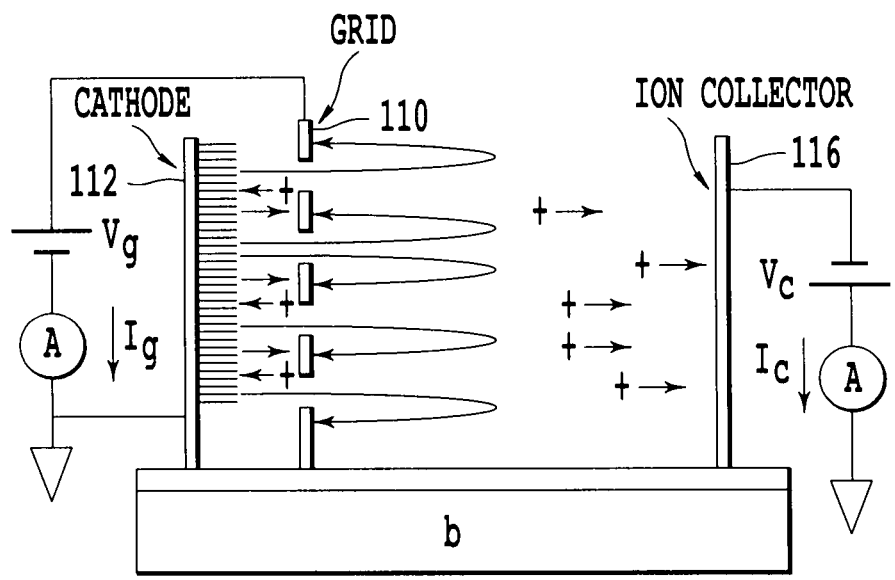
FIG. 8B is a schematic of an ion source using the triode configuration of FIG. 8A.
Figure 9:
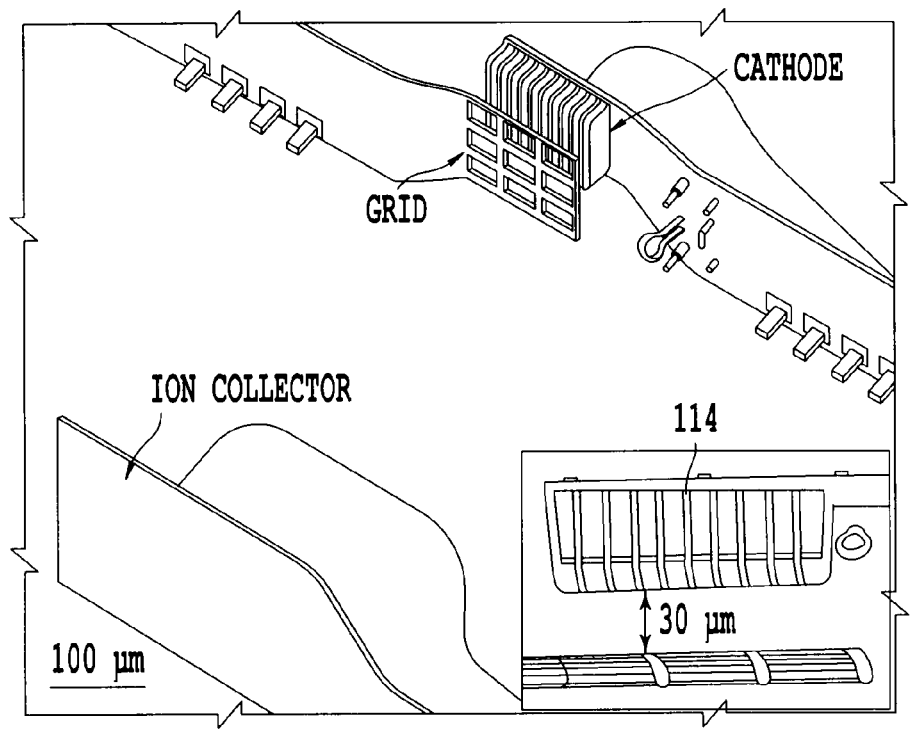
FIG. 9 is a SEM micrograph of an electron impact ions source for one embodiment of the invention.

In one embodiment, the charge particle source can be an electron source 102 or ion source 104 fabricated on a silicon substrate and utilizing for example a carbon nanotube field emission electron source including as shown in FIGS. 8A and 8B a cathode with aligned carbon nanotubes, a control grid, and a collector or extraction electrode. The collector electrode will be discussed below as the collector electrode permits one to build and test an ion source before utilizing such a source as a free-standing or integrated part of a detector array. The extraction electrode which contains a grid or slit will be used to provide a bias so as to extract ions from an ionization region after the control grid. FIG. 8A is a schematic of a triode configuration for one embodiment of the invention for an electron source 102. FIG. 8B is a schematic of an electron-impact ion source 104 using the triode configuration of FIG. 8A. FIG. 9 is a SEM micrograph of a triode that can be operated as an electron source or an electron-impact ion source for one embodiment of the invention.

The generation of gas phase ions by electron impact is a common technique in the fields of mass spectrometry and vacuum science. In mass spectrometry, electron-impact sources ionize gas phase analytes prior to mass separation and ion detection. In vacuum science, ion vacuum gauges, residual gas analyzers, and He leak detectors all operate using electron-impact ionization. Thermionic cathodes are reliable and effective for many applications; however, the power consumption associated with heating these cathodes is a major limitation in developing miniature field-portable ion sources. In many emerging applications such as field-portable mass spectrometers; the power required to heat the thermionic electron source could exceed the combined power requirements of all other system components. Therefore, field emission cold cathodes which nominally operate at room temperature are attractive for some electron-impact applications. Workers have evaluated a number of cold cathode materials including for example diamond-coated silicon whiskers for application in an ion trap mass spectrometer, carbon nanotubes (CNTs) and molybdenum tips as an electron source in vacuum ion gauges, and integrated field emitters for electron-impact ionization inside field emission displays. Additional benefits of field emission sources are the fast turn on and the ability to run in a pulsed mode. Thermionic technology does not readily scale down to microdevices, while field emission devices are naturally microscale and have the potential to generate larger emitted current densities.

FIG. 8A depicts a vacuum triode device with both the grid and the anode biased positively with respect to the grounded cathode to provide an electron source 102. FIG. 8B illustrates one embodiment of how electron-impact ionization can be utilized with the same device to serve as an ion source 104. A positively biased grid affects the field emission of electrons from the cathode 112. Some percentage of the emitted electrons passes through the grid apertures 110 into the region between the grid and the negatively biased ion collector 116. The electrons are decelerated by the collector bias and ultimately deflected back towards the grid 110 if the collector voltage is large enough. If an electron-impact ionization event occurs in this region between the grid 110 and the collector 116, the positively charged ion will be accelerated towards the collector electrode. The collector electrode 116 may contain a grid or a slit that enables these ions to pass through for example to a detector array of the invention. If an electron-impact event occurs in the region between the cathode 112 and grid 110, the generated ion will be accelerated into the cathode, possibly damaging the electron emitters.

One illustrative fabrication process by which the ion source of FIG. 9 can be made is described below. More details of the fabrication and the characterization are found in Bower et al, "On-chip electron-impact ion source using carbon nanotube field emitters," Applied Physics Letters 90, 124102 (2007) published online Mar. 20, 2007, the entire contents of which are incorporated herein by reference.

As described therein, polycrystalline silicon structures that form the device electrodes were initially formed parallel with the substrate surface and embedded in highly doped silicon dioxide. A MEMS foundry such as for example MEMSCAP Inc., Durham, N.C. was used for fabrication of the ion source. After the MEMS fabrication, the sacrificial silicon dioxide was etched in hydrofluoric acid to release the electrode panels. The catalyst for CNT growth, in this example 50 Å of iron, was selectively evaporated onto the cathode using an integrated shadow mask. The CNTs were grown using microwave plasma chemical vapor deposition with ammonia/methane gas chemistry. Electron microscopy revealed multi-walled CNTs with an average diameter of approximately 30 nm. The CNT length was controlled by varying the growth time. After CNT deposition, the panels were manually rotated and locked in place normal to the substrate using a tongue-in-groove MEMS technique. The device was mounted and wire bonded to a ceramic board for testing. The specific device characterized here has a cathode-to-grid spacing of 50 μm before CNT deposition, a cathode-to-grid spacing of 30 μm after CNT deposition, and a grid-to-collector spacing of 280 μm. The cathode produced was a 70×70 μm² panel and the grid produced was a 3×3 array of 20×20 μm² apertures, with a 2.5 μm grid wire. With this configuration, the electric fields required to generate 1 nA and 1 μA of electron current were 5 and 6 V/μm, respectively. These devices were routinely capable of generating field emitted electron current in excess of 50 μA.

A better understanding of the configuration, the fabrication, and the testing results for the triode ion source described above will be had with reference to the following more detailed discussion. FIG. 8A is a schematic diagram of one embodiment of the triode of the invention, where $V_g$ is the applied grid voltage, $V_a$ is the anode voltage, and $I_a$ is the measured anode current. According to one embodiment of the present invention, the ion source 104 ionizes molecules using either electron impact ionization or field ionization. In the electron impact ionization source of FIG. 8B, the grid electrode 110 is biased positively with respect to the cathode electrode 112 to cause electron emission. Electrons gain kinetic energy based on this voltage and can impact ionize analyte ions in the gas in the vicinity of the grid electrode 110. By way of contrast, in a field ionization source (which the invention can utilize as well and which FIG. 8A can be considered a diagram for provided the biases on the cathode and anode elements were reversed), the grid electrode 110 is biased negatively with respect to the cathode electrode 112. The negative voltage does not promote electron emission but rather generates a high electric field (for example about the carbon nanotubes 114 shown in FIG. 9 (and FIG. 10C) that can field ionize analyte species in the vicinity of the grid electrode 110.

Figure 10A:
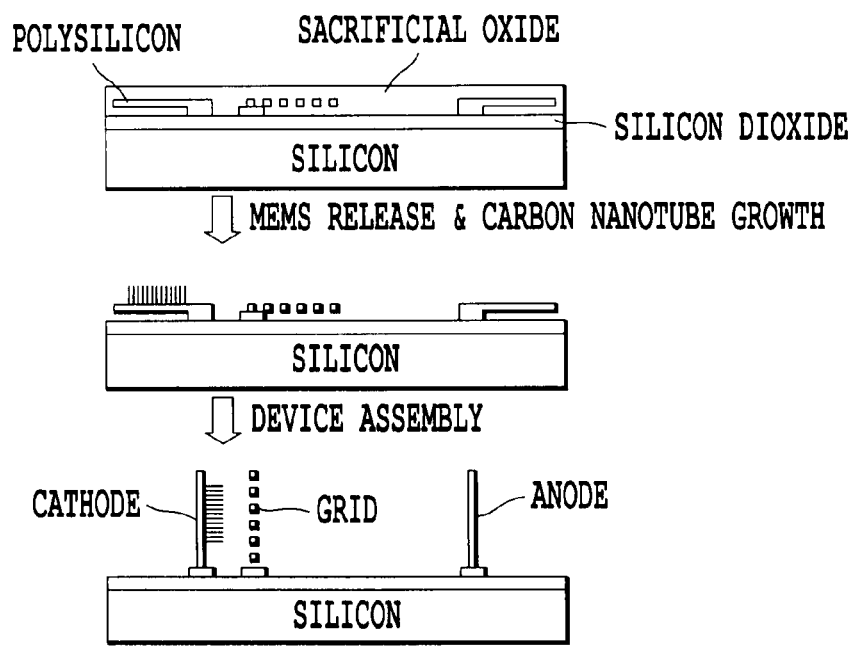
FIG. 10A is a schematic illustrating a process according to one embodiment of the present invention to fabricate the exemplary microtriode ion source of FIG. 9.

FIG. 10A depicts a process to fabricate an exemplary on-chip vacuum microtriode that can be used to implement ion source 104. In this illustrative, non-limiting process, a silicon dioxide layer 128 is thermally grown on a silicon substrate 130 serving as a support of the ion source 104 and the ion collector 106. After which various layers of a sacrificial oxide 132 are deposited using for example plasma enhanced chemical vapor deposition. In this illustrative process, a first sacrificial oxide layer can be deposited, after which the first sacrificial oxide layer is patterned to form holes 134 exposing the underlying silicon dioxide. Polysilicon layer 136 can be deposited using plasma enhanced chemical vapor deposition to cover the first sacrificial oxide layer and fill the holes 134 with polysilicon. The polysilicon layer 136 is patterned to form the structures shown in FIG. 11B including the grid pattern denoted in FIG. 11B and the tapered pattern on the anode electrode 142. A second sacrificial oxide layer can then be deposited over the entire structure. After which, both sacrificial oxide layers are removed to release the polysilicon structures.

Figure 10B:
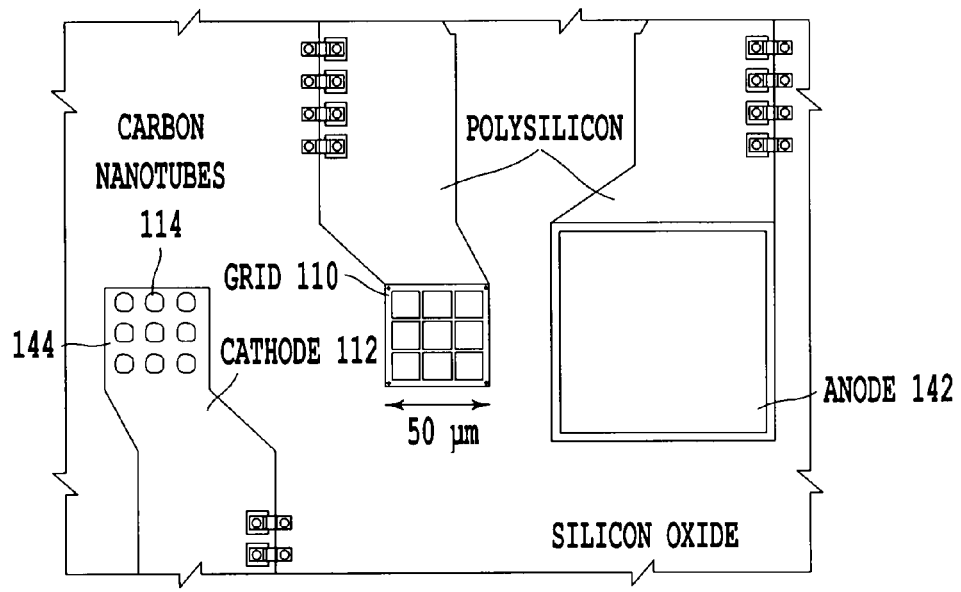
FIG. 10B is an optical micrograph showing a top view of the exemplary microtriode ion source depicted in FIG. 9, prior to release of the anode, cathode, and grid from the underlying silicon substrate.

Carbon nanotubes 114 can then be formed on for example the cathode electrode 144 shown in FIG. 10B, using the techniques for carbon nanotube growth as discussed above. Afterwards, the polysilicon panels can be rotated and locked into place, producing the structure shown in FIG. 10C.

During ionization testing of the triode of FIG. 9, a quantitative measure of the electron current ($I_e$) that passes into the ionization volume is unavailable because all of the emitted electrons are eventually captured by the grid. However, the measured grid current ($I_g$) should be proportional to the electron current ($I_e$) during electron-impact ionization ($I_g \alpha I_e$). In a He atmosphere, the emitted electron current (measured at both $10^{-5}$ Torr and 50 mTorr) did not exhibit a strong dependence on gas pressure. The ion current did increase as He chamber pressure increased, as expected from electron-impact theory. At the chamber base pressure the measured ion collector current is less than 10 pA, while at a pressure of 50 mTorr the ion current approaches 100 nA, representing four orders of magnitude change. The ion current began to saturate as the grid voltage was increased. Other gasses such as Ar and Xe also showed similar performance, with these larger gasses exhibiting larger ratios of collector current to grid current.

These results show the viability of this on-chip ion source as an ion source for a system utilizing the Faraday cup arrays of the invention.

Figure 11:
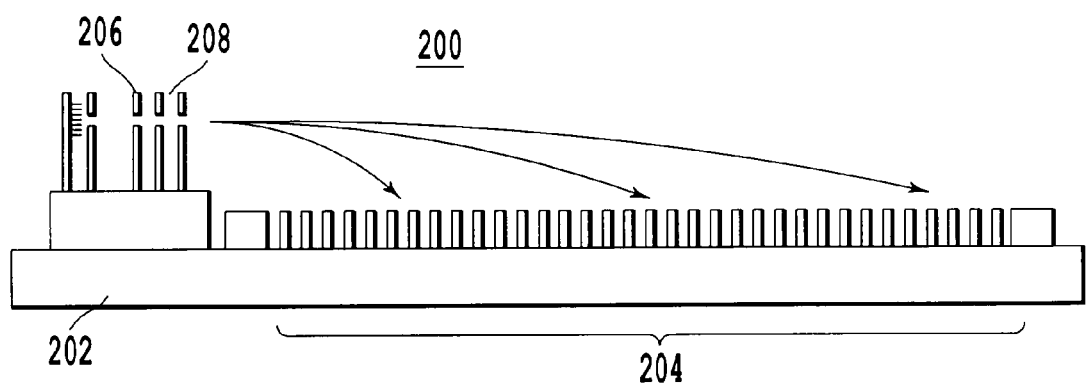
FIG. 11 is a schematic of an integrated ion source and detector array according to one embodiment of the invention.

FIG. 11 is a schematic of an integrated ion source and detector array according to one embodiment of the invention. In this embodiment, an ion source such as ion source 104 is attached to a portion of the substrate 202 removed from the trenches and collectors. Accordingly, FIG. 12 depicts a detector array 200 including substrate 202 having a bonded wafer containing a plurality of trenches 204 disposed for example in sequence.

A plurality of collectors (not explicitly shown in this depiction) are disposed in the trenches 204. The collectors as in the other embodiments can collect charged particles incident on respective ones of the collectors and to output from the collectors signals indicative of charged particle collection. As shown in FIG. 12, the integrated ion source 206 is attached to a portion of the substrate removed from the trenches 204.

The ion source by way of grids 208 can direct ions across the detector array 200. For example, a magnetic field sector (not shown as the magnetic field lines permeate the structure shown in FIG. 12) can deflect the ions along different trajectories to impinge the ions on different ones of the collectors depending on a charge-to-mass ratio of the ions.

Figure 10C:
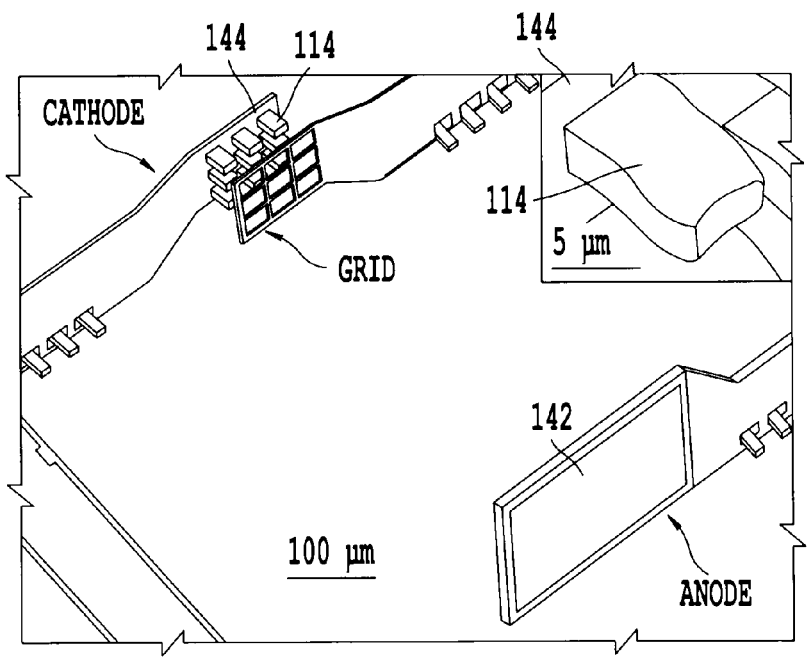
FIG. 10C is an electron micrograph of the exemplary microtriode ion source depicted in FIG. 9.

Ion source 206 can include an electrode (e.g., a cathode) including a carbon nanotube as shown in FIG. 10C. The carbon nanotube can be disposed on an electrode support spacing the carbon nanotube a distance above a surface of the substrate. The electrode as in other embodiments can be configured to field ionize or electron impact ionize a gas phase analyte in a vicinity of the electrode. Grids 208 in ion source 206 can be configured to be an acceleration grid directing ions across the detector array 200. Ion source 206 can be configured as in other embodiments to generate ion beams by selectively using electron impact ionization or direct field ionization.

Numerous modifications and variations of the invention are possible in light of the above teachings. It is therefore to be understood that within the scope of the appended claims, the invention may be practiced otherwise than as specifically described herein.

The invention claimed is:

1. A detector array comprising:
   a substrate including a plurality of trenches formed therein;
   a plurality of collectors electrically isolated from each other, formed on the walls of the trenches, and configured to collect charged particles incident on respective ones of the collectors and to output from said collectors signals indicative of charged particle collection;
   a plurality of readout connections connecting to respective ones of the collectors;
   a plurality of readout circuits disposed on a side of the substrate opposite openings to the collectors and connected to the plurality of readout connections, said readout circuits configured to read said signals from respective ones of the plurality of collectors indicative of charged particle collection; and
   each of said readout circuits corresponding to only one of said collectors.

2. The array of claim 1, wherein the trenches comprise widths ranging from 5 μm to 100 μm and having lengths up to 10 mm.

3. The array of claim 1, wherein the trenches comprise an aspect ratio ranging from 4:1 to 12:1.

4. The array of claim 1, wherein the plurality of collectors occupies more than 80% of a surface of the substrate.

5. The array of claim 1, wherein the plurality of collectors occupies more than 90% of a surface of the substrate.

6. The array of claim 1, wherein the plurality of collectors occupies more than 95% of a surface of the substrate.

7. The array of claim 1, wherein the collectors comprise an array of position sensitive detectors.

8. The array of claim 1, wherein the collectors comprise a metal layer including at least one of copper, aluminum, gold, platinum, and tungsten.

9. The array of claim 8, wherein the metal layer includes at least one of a ground reference and a suppression grid for the detector array.

10. The array of claim 1, further comprising:
    an electron-injector material disposed in a vicinity of the collectors and configured to emit an electron as the charged particle upon receiving light or x-ray thereon.

11. The array of claim 1, wherein a substrate wall between the trenches includes a thermal silicon dioxide layer.

12. The array of claim 1, wherein a substrate wall between the trenches has a thickness less than 50 μm.

13. The array of claim 1, wherein the collectors have an isolation resistance between adjacent ones of the collectors greater than $1 \times 10^{10} \Omega$.

14. The array of claim 1, wherein the plurality of collectors comprises at least one of a Faraday cup array, a detector for a magnetic sector field detector, a detectors in scanning or transmission electron microscope, a charged particle detector, an x-ray detector, a photon detector, and a detector in an ion mobility spectrometer.

15. The array of claim 1, wherein the substrate comprises a silicon substrate including the plurality of trenches formed therein.

16. A method for making a detector array, comprising:
   forming in a substrate a plurality of trenches across a surface of the substrate;
   forming in the plurality of trenches a plurality of collectors;
   forming a plurality of readout connections on a side of the substrate opposite openings to the collectors, said readout connections configured to collect signals from respective ones of the plurality of collectors indicative of charged particle collection;
   connecting respective ones of the plurality of readout connections to 1) respective ones of the plurality of the collectors and 2) readout circuits, wherein each of said readout circuits corresponds to only one of said collectors.

17. The method of claim 16, wherein forming the trenches comprises:
   forming said trenches having widths ranging from 5 μm to 100 μm and lengths up to 10 mm.

18. The method of claim 16, wherein forming the trenches comprises:
   forming said trenches having an aspect ratio ranging from 4:1 to 12:1.

19. The method of claim 16, wherein forming the trenches comprises:
   forming said trenches to occupy more than 80% of a surface of the substrate.

20. The method of claim 16, wherein forming the trenches comprises:
   forming said trenches to occupy more than 90% of a surface of the substrate.

21. The method of claim 16, wherein forming the trenches comprises:
   forming said trenches to occupy more than 95% of a surface of the substrate.

22. The method of claim 16, wherein forming the trenches comprises:
   leaving a substrate wall between the trenches of a thickness less than 50 μm.

23. The method of claim 16, wherein forming the collectors comprises:
   forming collectors of at least one of copper, aluminum, gold, platinum, and tungsten.

24. The method of claim 16, further comprising:
   patterning a metal layer on the substrate in a vicinity of the collectors.

25. The method of claim 16, wherein forming a plurality of readout connections comprises:
   bonding a readout circuit wafer including readout circuits to the substrate, said readout circuits for collection and processing of said signals indicative of charged particle collection.

26. The method of claim 16, wherein forming a plurality of readout connections comprises:
   bonding a landing circuit to the substrate, said landing circuit having landing pads for connection to the collectors and contact pads for connection to readout circuitry for collection and processing of said signals indicative of charged particle collection.

27. The method of claim 26, wherein forming a plurality of readout circuits comprises:
   connecting said contact pads to said readout circuitry on the landing substrate.

28. The method of claim 26, wherein forming a plurality of readout circuits comprises:
   connecting said contact pads to said readout circuitry removed from the landing substrate.

29. The method of claim 16, wherein forming a plurality of trenches comprises:
   forming a thermal silicon dioxide layer on the trenches.

30. A system for collecting charged particles, comprising:
   a charged particle source configured to produce the charged particles; and
   a detector array configured to collect the charged particles, and including,
   a substrate including a plurality of trenches formed therein,
   a plurality of collectors electrically isolated from each other, formed on the walls of the trenches, and configured to collect charge particles incident on respective ones of the collectors and to output from said collectors signals indicative of charged particle collection, a plurality of readout connections connecting to respective ones of the collectors;
   a plurality of readout circuits disposed on a side of the substrate opposite openings to the collectors and connected to the plurality of readout connections, said readout circuits configured to read said signals from respective ones of the plurality of collectors indicative of charged particle collection; and
   each of said readout circuits corresponds to only one of said collectors.

31. The system of claim 30, wherein the charged particle source includes at least one of an ion source and an electron source.

32. The system of claim 30, wherein the charged particle source includes an electron-injector material disposed in a vicinity of the collectors and configured to emit an electron as the charged particle upon receiving light or x-ray thereon.

33. The system of claim 30, wherein the charged particle source includes an electron-injector material disposed in the plurality of trenches and configured to emit an electron as the charged particle upon receiving a high energy particle thereon.

34. The system of claim 30, wherein the detector array comprises at least one of a Faraday cup array, a magnetic sector field detector, a detectors in scanning or transmission electron microscope, a charged particle detector, an x-ray detector, a photon detector, and a chemical sensor.

35. The system of claim 30, wherein the charged particle source includes an ion source configured to direct ions across the detector array.

36. The system of claim 35, further comprising:
   a magnetic field sector configured to deflect the ions along different trajectories so as to impinge the ions on different ones of the collectors depending on a charge-to-mass ratio of the ions.

37. The system of claim 35, wherein the ion source is configured to field ionize or electron impact ionize a gas phase analyte in a vicinity of an electrode.

38. The system of claim 35, wherein the ion source comprises at least one acceleration grid configured to direct ions across the detector array.

39. The system of claim 35, wherein the ion source comprises at least one of an electron impact ionization source and a field ionization source.

40. The system of claim 39, wherein the ion source is configured to generate ion beams by selectively using electron impact ionization or direct field ionization.

41. The system of claim 30, wherein the charged particle source comprises at least one carbon nanotube.

42. The array of claim 41, wherein the carbon nanotube is disposed on an electrode support spacing said carbon nanotube a distance above a surface of the substrate.

43. A detector array comprising:
   a substrate including a plurality of trenches formed in the substrate and disposed in sequence across a surface of the substrate;
   a plurality of collectors electrically isolated from each other, formed on the walls of the trenches, and configured to collect charged particles incident on respective ones of the collectors and to output from said collectors signals indicative of charged particle collection;
   a plurality of readout connections connecting to respective ones of the collectors;
   a plurality of readout circuits disposed on a side of the substrate opposite openings to the collectors and connected to the plurality of readout connections, said readout circuits configured to read said signals from respective ones of the plurality of collectors indicative of charged particle collection;
   each of said readout circuits corresponding to only one of said collectors; and
   an ion source attached to a portion of the substrate removed from the trenches.

44. The array of claim 43, wherein the ion source comprises at least one acceleration grid.

45. The system of claim 44, further comprising:
   a magnetic field sector configured to deflect the ions along different trajectories so as to impinge the ions on different ones of the collectors depending on a charge-to-mass ratio of the ions.

* * * * *